(12) United States Patent
Travis et al.

(10) Patent No.: US 9,245,817 B2
(45) Date of Patent: Jan. 26, 2016

(54) SEMICONDUCTOR DEVICE WITH EMBEDDED HEAT SPREADING

(71) Applicant: FREESCALE SEMICONDUCTOR, INC., Austin, TX (US)

(72) Inventors: Edward O. Travis, Austin, TX (US); Douglas M. Reber, Austin, TX (US); Mehul D. Shroff, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/331,904

(22) Filed: Jul. 15, 2014

(65) Prior Publication Data
US 2014/0329383 A1 Nov. 6, 2014

Related U.S. Application Data

(62) Division of application No. 13/442,014, filed on Apr. 9, 2012, now Pat. No. 8,796,841.

(51) Int. Cl.
*H01L 23/373* (2006.01)
*H01L 23/367* (2006.01)
*H01L 21/768* (2006.01)
*H01L 23/522* (2006.01)

(52) U.S. Cl.
CPC .......... *H01L 23/373* (2013.01); *H01L 21/768* (2013.01); *H01L 23/3677* (2013.01); *H01L 23/522* (2013.01); *H01L 2924/0002* (2013.01)

(58) Field of Classification Search
CPC .. H01L 23/373; H01L 23/3677; H01L 21/768
See application file for complete search history.

(56) References Cited

U.S. PATENT DOCUMENTS

| | | | |
|---|---|---|---|
| 4,733,293 A | 3/1988 | Gabuzda |
| 5,057,908 A | 10/1991 | Weber |
| 5,313,094 A | 5/1994 | Beyer et al. |
| 5,744,865 A | 4/1998 | Jeng et al. |
| 6,424,531 B1 | 7/2002 | Bhatti et al. |
| 6,714,415 B1 | 3/2004 | Shah |
| 7,180,791 B2 | 2/2007 | Roohparvar |
| 7,345,364 B2 | 3/2008 | Kerr et al. |
| 7,462,942 B2 | 12/2008 | Tan et al. |
| 7,472,363 B1 | 12/2008 | Chandra |
| 7,869,784 B2 | 1/2011 | Liu |
| 2007/0023923 A1 | 2/2007 | Salmon |

(Continued)

OTHER PUBLICATIONS

Magill; "Active Thermal Management—A Bottoms up Approach", Feb. 19, 2009; 17 Pgs; Nextreme Thermal Solutions.

(Continued)

*Primary Examiner* — Long Pham

(57) ABSTRACT

A semiconductor device includes a semiconductor substrate and a plurality of clock drivers, wherein the plurality of clock drivers comprises substantially all clock drivers of the semiconductor device, and an interconnect region over the semiconductor substrate, wherein the interconnect region comprises a plurality of heat spreaders, wherein at least 25% of the plurality of clock drivers have a corresponding heat spreader of the plurality of heat spreaders. Each corresponding heat spreader of the plurality of heat spreaders covers at least 50% of a transistor within a corresponding clock driver of the plurality of clock drivers and extends across at least 70% of a perimeter of the transistor within the corresponding clock driver.

14 Claims, 6 Drawing Sheets

(56) References Cited

U.S. PATENT DOCUMENTS

2009/0102046 A1 4/2009 Dimitrakopoulos et al.
2011/0027943 A1 2/2011 Gurrum et al.

OTHER PUBLICATIONS

Nextreme Thermal Solutions; "The Thermal Copper Pillar Bump", Jan. 9, 2008; 12 Pgs.; Nextreme Thermal Solutions.

Brown et al.; "Logic Detailed Structural Analysis with Gate Dielectric Analysis of the Intel 45 nm QX9650 Penryn Processor"; Nov. 2007; 37 Pgs.; Semiconductor Insights Inc.

Schneider et al.; "Thin Film Thermoelectric Power Generation-Enabling Waste Heat Recovery in High Heat Flux Environments"; May 3, 2007; 25 Pgs.; Nextreme Thermal Solutions.

Office Action mailed Feb. 28, 2013 in U.S. Appl. No. 13/442,015.

U.S. Appl. No. 13/442,015, "Semiconductor Device With Heat Dissipation", filed Apr. 9, 2012—Notice of Allowance, mailed Jul. 10, 2013.

SEMICONDUCTOR DEVICE WITH EMBEDDED HEAT SPREADING

CROSS-REFERENCE TO RELATED APPLICATION

This application is related to U.S. patent application Ser. No. 13/442,015, filed on even date, titled "SEMICONDUCTOR DEVICE WITH HEAT DISSIPATION," naming Edward O. Travis, Douglas M. Reber, and Mehul Shroff as inventors, and assigned to the current assignee hereof.

BACKGROUND

1. Field

This disclosure relates generally to semiconductor devices, and more specifically, to heat spreading that is embedded within the semiconductor devices.

2. Related Art

Heat build-up during circuit operation is an issue for reliability of integrated circuits. Techniques for addressing this issue include embedded techniques and techniques that are applied externally to the integrated circuits. These two approaches can generally be used together. Thus an improvement with one approach can be additive to the other approach. One of the issues in particular is peak temperature which can be the primary of cause of a heat-related failure. The issues related to addressing excessive heating include optimizing the size of the package and size of the particular semiconductor device and materials that can be used. Also, the degree of attachment and proximity of the particular heat spreader are significant.

Accordingly, there is a need for an improvement in heat spreading for semiconductor devices that addresses one or more of the issues raised above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 5 1 is a top view of the semiconductor device at a stage in processing subsequent to that shown in FIGS. 3 and 4;

DETAILED DESCRIPTION

A semiconductor device has a particular circuit with a relatively high susceptibility to failure due to heating. The particular circuit has at least 50 percent of its area covered by and overlying conductive layer. The conductive layer may extend outward from the semiconductor device with an area at least twice that of the area of the particular circuit. This is better understood by reference to the drawings and the following description.

The semiconductor substrate described herein can be any semiconductor material or combinations of materials, such as gallium arsenide, silicon germanium, silicon-on-insulator (SOI), silicon, monocrystalline silicon, the like, and combinations of the above.

Figure 1:
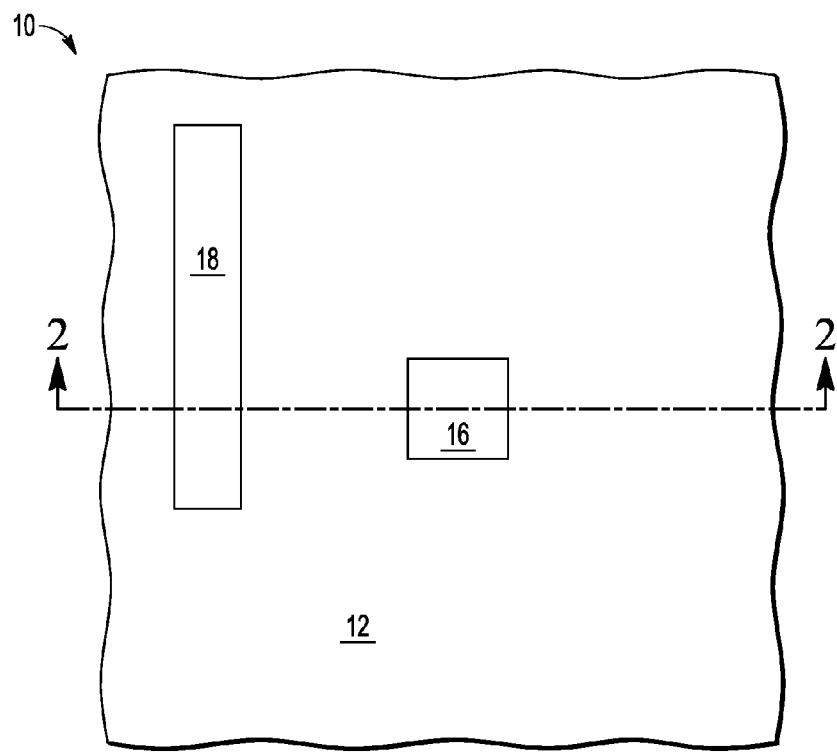
FIG. 1 is a top view of a semiconductor device at a stage in processing.

Shown in FIG. 1 is a portion of a semiconductor device 10, in a top view, having a substrate 12, a circuit 16, and a circuit 18. In this case, circuit 16 is a circuit that, in operation, generates heat that would be sufficient to result in a reliability issue as compared to at least some other circuits such as circuit 18. High heat circuits are most commonly circuits that have relatively high voltage and relatively high current. This is most likely to occur for circuits that are operating at high switching speeds. A clock driver is one example of a likely candidate for such a circuit that generates more heat than the typical circuits and accordingly tends to operate at a higher temperature. If the higher temperature does occur, then the circuit can tend to have a reliability issue because of the higher temperature. Other examples are circuits driving large loads and large analog resistors.

Figure 2:
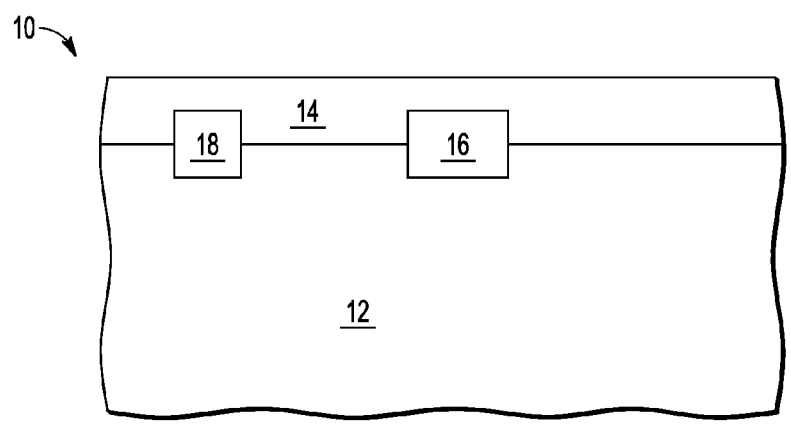
FIG. 2 is a cross sectional view of the semiconductor device of FIG. 1.

Shown in FIG. 2 is a cross section of the portion of semiconductor device 10 shown in FIG. 1 showing an interlayer dielectric (ILD) layer 14. This shows that circuits 16 and 18 are in both substrate 12 and above substrate 12 and covered by ILD layer 14.

Figure 3:
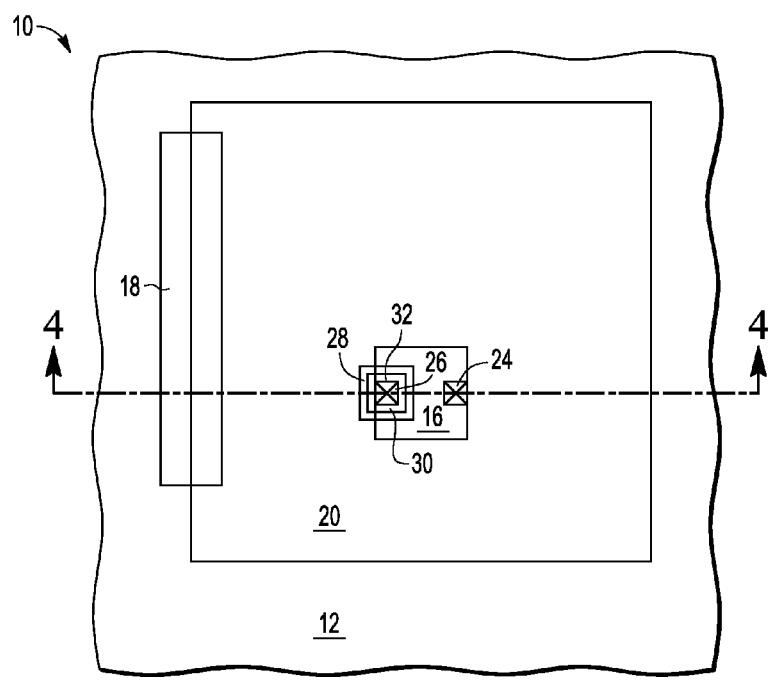
FIG. 3 is a top view of the semiconductor device at a stage in processing subsequent to that shown in FIGS. 1 and 2.
Figure 4:
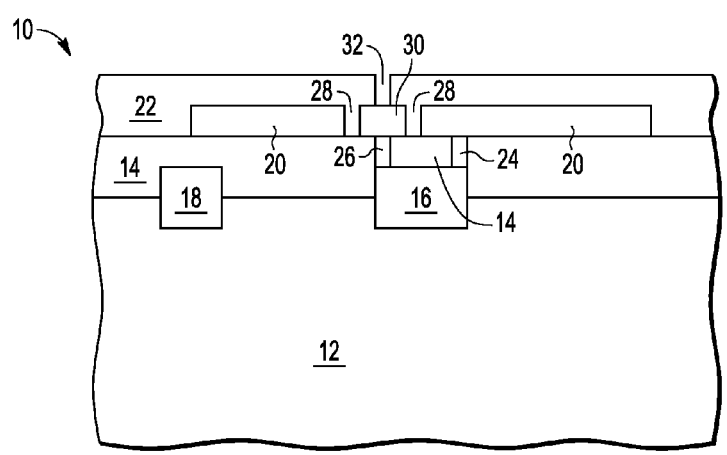
FIG. 4 is a cross sectional view of the semiconductor device of FIG. 3.

Shown in FIG. 3 is the portion of semiconductor device 10, in top view, and in FIG. 4, in cross section, after forming a conductive layer 20 over ILD layer 14, a via 24 between conductive layer 20 and circuit 16, a via 26 between conductive layer 20 and a conductive portion 30, an area 28 around conductive portion 30, an ILD layer 22 covering conductive layer 20, and an opening 32 over conductive portion 30. Openings are formed in ILD layer 14 for vias 24 and 26. Conductive layer 20 is formed over circuit 16. Well-known techniques exist for forming conductive layer 20. Most commonly copper or aluminum are used for this type of conductive layer formation but other conductive materials may also be used alone or in combination. Either in the formation or by subsequent patterned etch, conductive layer 20 has opening 28 surrounding conductive portion 30. After forming ILD layer 22, opening 32 may be formed by a patterned etch. ILD layer 22 may be a composite layer formed at different times. For example, a first portion may be formed and patterned prior to the formation of conductive layer 20 and a second portion after the formation of conductive layer 20. Conductive layer 20 has an area much larger than the area of circuit 16. Conductive layer 20 is formed as part of an interconnect layer that is used to provide connections among circuit elements such as transistors. Although there may be some power connections also, an interconnect layer is for communicating signals. A different layer or layers from an interconnect layer may be present that are predominately for coupling power to the circuits and are sometimes called a power plane because such layers typically have relatively large sheets of metal for carrying power and ground.

Figure 5:
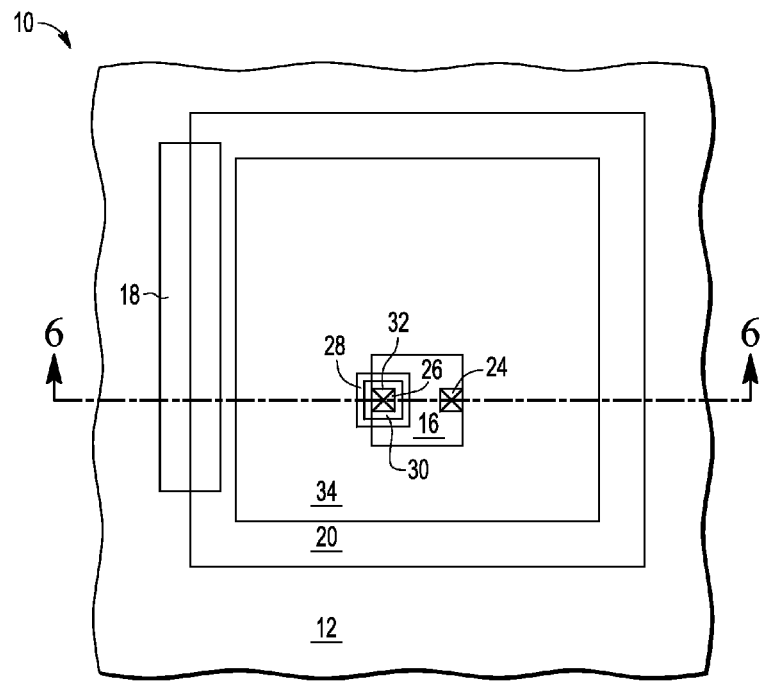
Figure 6:
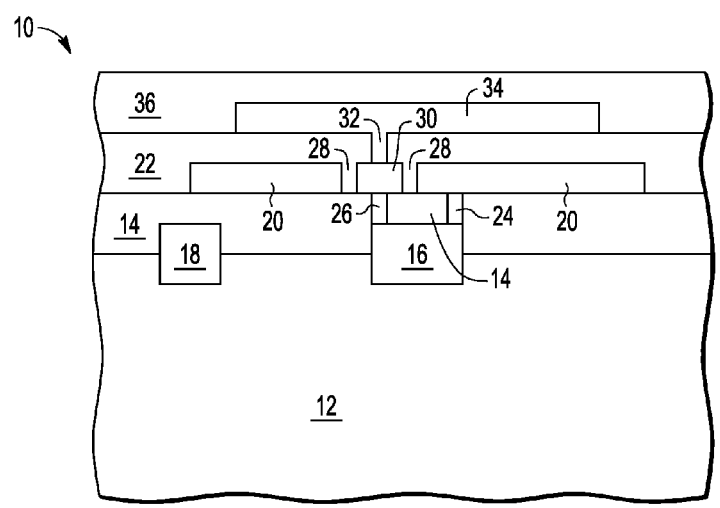
FIG. 6 is a cross sectional view of the semiconductor device of FIG. 5.

Shown in FIG. 5 is the portion of semiconductor device 10, in top view, and in FIG. 6, in cross section, after forming conductive layer 34 over ILD layer 22 and in opening 32 and an ILD layer 36 covering conductive layer 34. Conductive layer 34 may be of the same material as conductive layer 20 or a different material and may also have multiple layers of different materials and is preferably square assuming space is available for that. For example the filling of opening 32 may include forming conductive barrier layers. This may also be true for vias 24 and 26 which may similarly include first forming conductive barrier layers followed by forming the vias from the deposition of conductive layer 20. Conductive layer 34 is also an interconnect layer that functions as such. One or more interconnect layers or a portion thereof may be referenced as an interconnect region.

Figure 7:
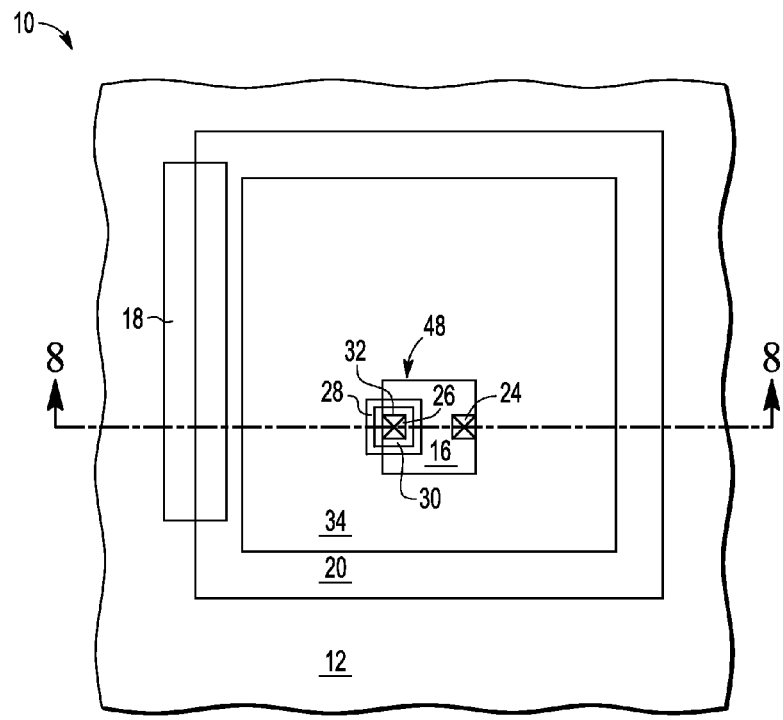
FIG. 7 is the top view of the semiconductor device shown in FIG. 5 with additional labeling.
Figure 8:
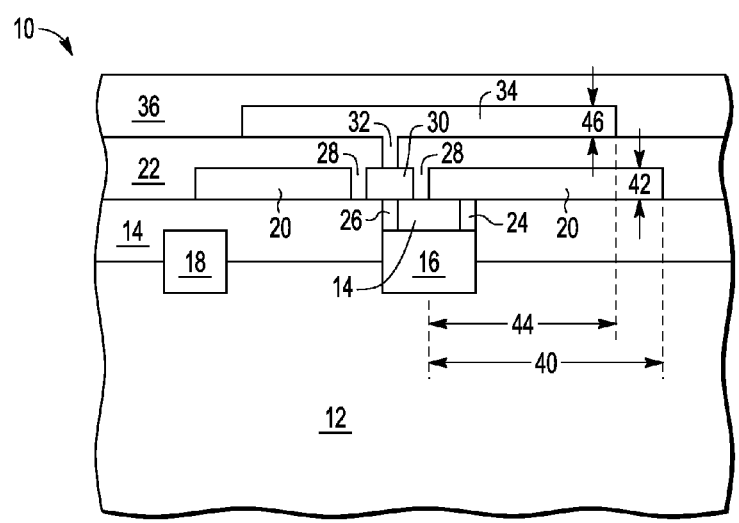
FIG. 8 is a cross sectional view of the semiconductor device of FIG. 6 with additional labeling.

Shown in FIG. 7 is the portion of semiconductor device 10, in top view, and in FIG. 8, in cross section shows dimensions length 40, thickness 42, length 44, and thickness 46, in FIG. 7, and an area 48, shown in FIG. 7. Area 48 is the area of circuit 16 as viewed from the top view of FIG. 7. The border of area 48 may also be called the perimeter of circuit of 16. Length 40 is a distance from a center of circuit 16 to a side of conductive layer 20. In this example, conductive layer 20 is in the shape of a square so that conductive layer 20 is two times length 40 on a side and thus its area is the square of two times length 40. Thickness 42 is the thickness of conductive layer 20. Thickness 42 is relevant to what length 44 will continue to provide benefit in spreading heat from circuit 16. There is a point at which increasing length provides little incremental benefit. The thicker the line is, the more the length will provide a given benefit in terms of temperature gradient. Thus the potential benefit is a function of thickness 42. The thicker thickness 42 is, the more potential benefit there is. The thickness of conductive layer 34 is thickness 46. Conductive layer 34 has a length 44 from the center of circuit 16. Heat from circuit 16 is transmitted from conductive layers 20 and 34 outward from circuit 16. The length that conductive layer 20 extends beyond the perimeter of circuit 16 is preferably at least 10 times thickness 42, but it is still beneficial if it is less. Even better is for conductive layer 20 to extend past the perimeter of circuit 16 by at least 20 times thickness 42. Conductive layer 20 and conductive layer 34 are both heat spreaders and both extend beyond 100 percent of the perimeter of circuit 16 but substantial benefit can be achieved with the extension of conductive layer 20 beyond the border of circuit 16 for less than 100 percent of the perimeter of circuit 16. For example, substantial benefit can be achieved by conductive layer 20 extending beyond at least 70 percent of the perimeter of circuit 16. Even better is for conductive layer 20 to extend beyond at least 80 percent of the perimeter of circuit 16.

Heat from circuit 16 is transmitted to conductive layer 20 through via 24 and ILD layer 14, especially directly over area 48. The combination of conductive portion 30 and conductive layer 20 is completely over area 48 except for opening 28. Opening 32 provides for contact, and thus heat conduction, between circuit 16 and conductive layer 34 through via 26, conductive portion 30, and to conductive layer 34, opening 32 being filled with conductive layer 34. Because this heat conduction path is metallic from circuit 16 to conductive layer 34, it is particularly effective. Heat is also conducted from conductive layer 20 to conductive layer 34 through ILD layer 22. Conductive layers 20 and 34 may be further connected. This further connection may be to power supplies such as power and ground. The via connections between circuit 16 and conductive layers 20 and 34 enhance heat transmission, but even without these via connections, conductive layers 20 and 34 would be useful in transmitting heat from circuit 16.

The effectiveness of the transmission of heat transfer is related to how much of area 48 is covered by a heat transmitting feature or feature such as conductive layer 20 or conductive layers 20 and 34. Conductive layer 20 should cover at least 50 percent of area 48 to cover at least 50 percent of the heat source. Even better is to cover at least 60 percent of circuit 16 with conductive layer 20. In the example shown, the coverage is more than 80 percent. The use of conductive layer 34 and its metallic connection to the heat source that is circuit 16 provides for enhanced heat conduction. Similarly conductive layer 34 should cover at least 50 percent of area 48 and would be even better to cover at least 60 percent. In this example, conductive layer 34 covers 100 percent of circuit 16. In this case all but opening 28 is covered by conductive layer 20 combined with conductive portion 30. A portion of opening 28 is filled with a portion of conductive layer 20, but that portion is not otherwise connected to conductive layer 20 so conductive layer 20 does not carry off much heat captured by conductive portion 30 although a very small amount of heat can flow laterally from conductive portion 30 through the ILD filling in opening 28 and into conductive layer 20. Conductive layer 34, however, does carry off a substantial amount of the heat captured by conductive portion 30. Conductive layer 34 also contributes to the heat transmission by capturing some heat from conductive layer 20 through ILD layer 22.

Whereas it is beneficial to have both conductive layers 20 and 34, it may be desirable to just use one conductive layer as a heat spreader in which case one of conductive layers 20 or 34 would not be present. In such case, it would be better for heat transmission purposes to have conductive layer 20 alone than to have conductive layer 34 alone because conductive layer 20 is closer to circuit 16 than conductive layer 34.

The particular type of circuit most likely to create heat is a clock driver because often clock drivers are driving a heavy load and are cycling at a high rate of speed. Also, there are often many clock drivers, and many of those are driving similar loads. Thus, the reliability issue is similar for many circuits. The actually likelihood for any one of the circuit drivers to fail due to heat may be quite low, but the likelihood of at least one among a large number may be problematic. Also due to layout constraints, it may be difficult to provide heat spreading for all problematic circuits using the solution described and shown for FIGS. 1-8. Much improvement in the likelihood of avoiding a failure can be achieved, however, by providing heat spreading for even 25 percent of the clock drivers.

Figure 9:
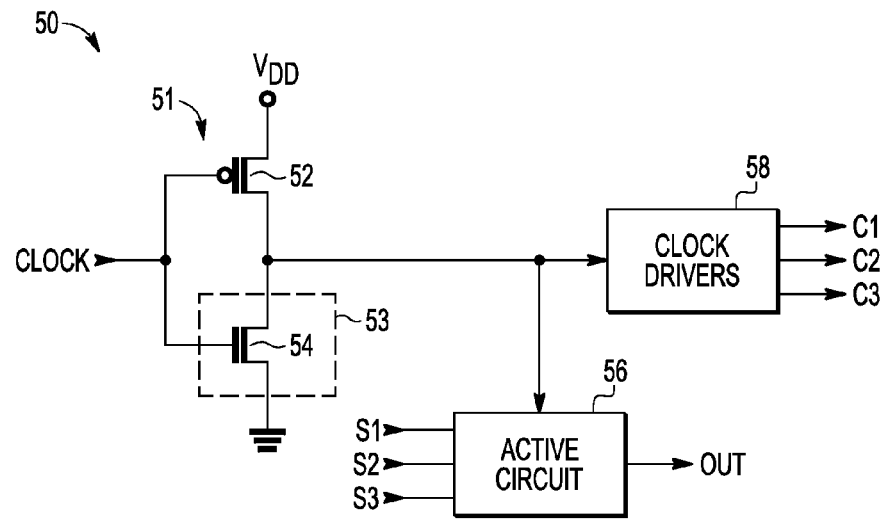
FIG. 9 is a combination circuit and block diagram showing a heat source that would be expected to benefit from a heat spreader shown in development in FIGS. 1-8.

Shown in FIG. 9 is a circuit 50 including a clock driver 51, a plurality of clock drivers 58, and an active circuit 56. Clock driver 51 includes a P-channel transistor 52 and an N-channel transistor 54. Transistor 54 is shown as having a perimeter 53. Transistor 52 has a source connected to a positive power supply terminal shown as VDD, a gate for receiving a clock, and a drain. Transistor 54 has a drain connected to the drain of transistor 52, a gate connected to the gate of transistor 52 and thus for receiving the clock, and a source connected to a negative power supply terminal, which is ground in this example. Active circuit 56 has signal inputs for receiving input signals S1, S2, and S3, a clock input coupled to the drains of transistors 52 and 54 which is the output of clock driver 51, and an output Out. Plurality of clock drivers 58 has an input coupled to the output of clock driver 51 and a plurality of clock outputs C1, C2, and C3. In this example, transistor 54 likely has the biggest issue with heat because it is an N-channel transistor and will thereby have more current drive capability for a given size. It is likely that the average current per unit time through transistors 52 and 54 will be the same, but transistor 54 will occupy less area. Thus, transistor 54 will be in greater need of heat spreading. Thus, the heat source can be considered transistor 54 and having perimeter 53. The perimeter transistor 54 is measured along an outer border of the active area or areas of transistor 54. It is common for transistors providing relatively large amounts of current be divided into several parallel transistors. In such case there would be multiple active areas for forming transistor 54 so that all of the active areas that make up transistor 54 would be within perimeter 53. Of course active areas can extend outside of the area of the transistor and those portions of an active area extending outside the area of the transistor would not be considered to be within perimeter 53. There may be cases where both the P-channel and the N-channel transistors are problematic and both may be appropriately covered by the heat spreader in which case the perimeter of the clock circuit would be considered both the the P-channel and the N-channel transistors.

Figure 10:
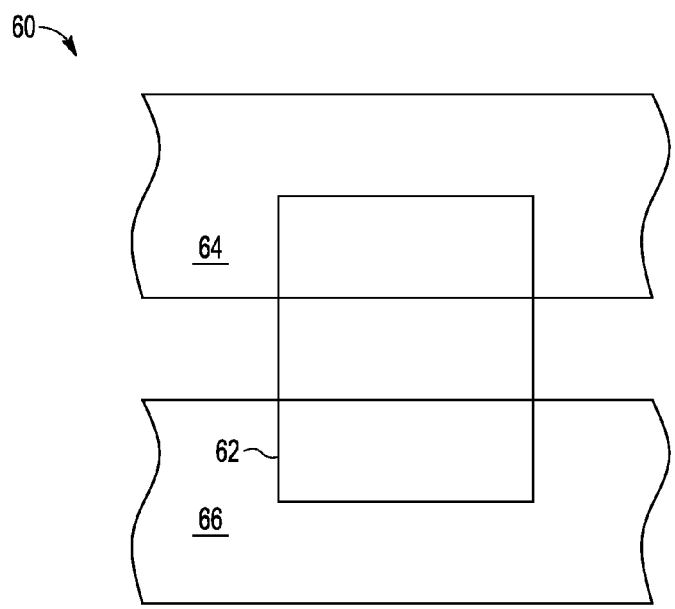
FIG. 10 is a top view showing that a heat spreader may be in discontinuous portions.

Shown in FIG. 10 is a simplified semiconductor device 60 including a heat source 62 and a heat spreader showing two separated portions 64 and 66 each formed in the manner described and shown in FIGS. 1-8. This shows that the heat spreader is in two discontinuous portions, portions 64 and 66. The combination of the two provides effective heat spreading by covering at least 50 percent of the heat source and being over at least 75 percent of the perimeter.

Figure 11:
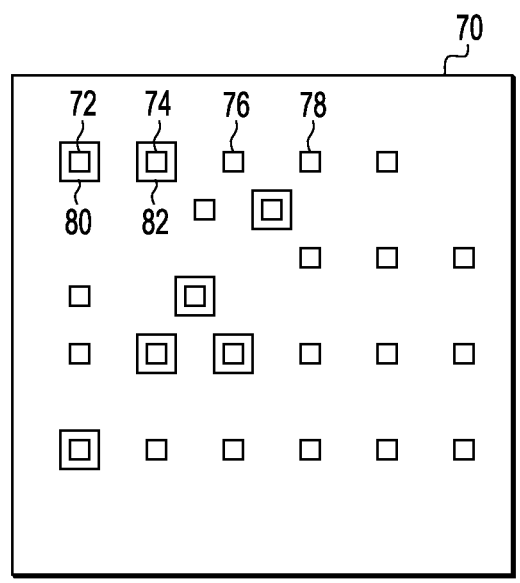
FIG. 11 shows multiple heat sources with a percentage having heat spreaders of the type shown in development in FIGS. 1-8.

Shown in FIG. 11 is a semiconductor device 70 having a plurality of heat sources of which heat source 72, 74, 76, and 78 are examples and a plurality of heat spreaders of which heat spreaders 80 and 82 over heat sources 72 and 74, respectively, are examples. As shown in FIG. 11, there are 24 heat sources of which 7 have heat spreaders over them. Each heat source may be a clock driver, and more particularly the transistor of the clock driver that carries the most average current per unit area. There is effectiveness if 25 percent or more of the heat sources have a heat spreader in the manner described and shown in FIGS. 1-8. Also the heat spreader can be in multiple portions as shown in FIG. 10.

Thus it is shown that heat spreading can be achieved with the semiconductor device using interconnect layers. The interconnect that is being used for heat spreading may or may not be connected to the heat source. The connection itself provides for enhanced heat spreading but such connection may be undesirable for other reasons. In such case substantial heat spreading can be achieved even without the connection or connections.

By now it should be appreciated that there has been provided a semiconductor device that includes a semiconductor substrate and a plurality of clock drivers, wherein the plurality of clock drivers comprises substantially all clock drivers of the semiconductor device. The semiconductor device further includes an interconnect region over the semiconductor substrate, wherein a first metal layer within the interconnect region comprises a plurality of heat spreaders, wherein at least 25% of the plurality of clock drivers have a corresponding heat spreader of the plurality of heat spreaders. Each corresponding heat spreader of the plurality of heat spreaders covers at least 50% of a transistor within a corresponding clock driver of the plurality of clock drivers and extends across at least 70% of a perimeter of the transistor within the corresponding clock driver. The semiconductor device may have a further characterization by which the at least 25% of the plurality of clock drivers is further characterized as at least 50% of the plurality of clock drivers. The semiconductor device may have a further characterization by which at least one heat spreader of the plurality of heat spreaders comprises at least two separate portions, wherein the at least two separate portions, in combination, cover at least 50% of a transistor within each corresponding clock driver and extend across at least 70% of a perimeter of the transistor within each corresponding clock driver. The semiconductor device may have a further characterization by which, for each of the at least one heat spreaders, a first separate portion of the at least two separate portions provides a first power signal to the corresponding clock driver and a second separate portion of the at least two separate portions provides a second power signal to the corresponding clock driver. The semiconductor device may have a further characterization by which each corresponding heat spreader of the plurality of heat spreaders extends beyond at least 70% of the perimeter of the transistor within the corresponding clock driver by at least 5 times a thickness of the corresponding heat spreader. The semiconductor device may have a further characterization by which each corresponding heat spreader of the plurality of heat spreaders is not electrically connected to the corresponding clock driver. The semiconductor device may have a further characterization by which each corresponding heat spreader of the plurality of heat spreaders provides a power signal to the corresponding clock driver. The semiconductor device may have a further characterization by which the transistor within each corresponding clock driver of the plurality of clock drivers is characterized as an N-channel transistor. The semiconductor device may have a further characterization by which a second metal layer within the interconnect region, different from the first metal layer, comprises a second plurality of heat spreaders, wherein the at least 25% of the clock drivers of the plurality of clock drivers have a corresponding heat spreader of the second plurality of heat spreaders, wherein each corresponding heat spreader of the second plurality of heat spreaders covers at least 50% of a transistor within a corresponding clock driver of the plurality of clock drivers and extends across at least 70% of a perimeter of the transistor within the corresponding clock driver. The semiconductor device may have a further characterization by which wherein the first and second metal layers are immediately adjacent metal layers of the interconnect region. The semiconductor device may have a further characterization by which there is no metal layer of the interconnect region between the first metal layer and the plurality of clock drivers. The semiconductor device may have a further characterization by which the plurality of clock drivers are made to operate at high switching speeds.

Also disclosed is a semiconductor device that includes a semiconductor substrate and a plurality of clock drivers, wherein the plurality of clock drivers comprises substantially all clock drivers of the semiconductor device. The semiconductor device further includes an interconnect region over the semiconductor substrate, wherein a first metal layer within the interconnect region comprises a plurality of heat spreaders, wherein at least 25% of the plurality of clock drivers have a corresponding heat spreader of the plurality of heat spreaders, wherein each corresponding heat spreader of the plurality of heat spreaders covers at least 50% of a transistor within a corresponding clock driver of the plurality of clock drivers, extends across at least 70% of a perimeter of the transistor within the corresponding clock driver, and has at least two separate portions. The semiconductor device may have a further characterization by which, for each corresponding heat spreader of the plurality of heat spreaders, a first separate portion of the at least two separate portions provides a first power signal to the corresponding clock driver and a second separate portion of the at least two separate portions provides a second power signal to the corresponding clock driver. The semiconductor device may have a further characterization by which the at least 25% of the plurality of clock drivers is further characterized as at least 50% of the plurality of clock drivers. The semiconductor device may have a further characterization by which there is no metal layer of the interconnect region between the first metal layer and the plurality of clock drivers. The semiconductor device may have a further characterization by which wherein the transistor within each corresponding clock driver of the plurality of clock drivers is characterized as an N-channel transistor.

Described also is a method for forming a semiconductor device. The method includes identifying at least 25% of a plurality of clock drivers, wherein the plurality of clock drivers comprises substantially all clock drivers of the semiconductor device. The method further includes forming an interconnect region over the plurality of clock drivers. The forming the interconnect region includes forming a first metal layer over the plurality of clock drivers, wherein the first metal layer comprises a plurality of heat spreaders, wherein each of the at least 25% of the plurality of clock drivers have a corresponding heat spreader of the plurality of heat spreaders. Each corresponding heat spreader of the plurality of heat spreaders covers at least 50% of a transistor within a corresponding clock driver of the plurality of clock drivers and extends across at least 70% of a perimeter of the transistor within the corresponding clock driver. The method may have a further characterization by which forming the interconnect region is performed such that each corresponding heat spreader of the plurality of heat spreaders provides a power signal to the corresponding clock driver. The method may have a further characterization by which the transistor within each corresponding clock driver of the plurality of clock drivers is characterized as an N-channel transistor.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for forming a semiconductor device comprising:
    identifying at least 25% of a plurality of clock drivers, wherein the plurality of clock drivers comprises substantially all clock drivers of the semiconductor device;
    forming an interconnect region over the plurality of clock drivers, wherein forming the interconnect region comprises:
        forming a first metal layer over the plurality of clock drivers, wherein the first metal layer comprises a plurality of heat spreaders, wherein each of the at least 25% of the plurality of clock drivers have a corresponding heat spreader of the plurality of heat spreaders, wherein:
            each corresponding heat spreader of the plurality of heat spreaders covers at least 50% of a transistor within a corresponding clock driver of the plurality of clock drivers and extends across at least 70% of a perimeter of the transistor within the corresponding clock driver.

2. The method of claim 1, wherein forming the interconnect region is performed such that each corresponding heat spreader of the plurality of heat spreaders provides a power signal to the corresponding clock driver.

3. The method of claim 1, wherein the transistor within each corresponding clock driver of the plurality of clock drivers is characterized as an N-channel transistor.

4. A method for forming a semiconductor device comprising:
    forming a first via and a second via in a first interlayer dielectric (ILD) layer that covers a circuit on a substrate of the semiconductor device, wherein the first via and the second via are formed within a perimeter of the circuit;
    forming a first conductive layer over the first ILD layer, including over the first via and the second via;
    patterning the first conductive layer to include a first opening in the first conductive layer, wherein the patterning forms a first conductive portion in thermal contact with the first via and a second conductive portion in thermal contact with the second via, and wherein the first conductive portion is separated from the second conductive portion by the first opening;
    forming a second ILD layer over the first and second conductive portions, including within the first opening;
    forming a second opening in the second ILD layer over the first conductive portion;
    forming a second conductive layer over the second ILD layer, including within the second opening in the second ILD layer;
    patterning the second conductive layer to form a third conductive portion in thermal contact with the first conductive portion; and
    forming a third ILD layer over the third conductive portion.

5. The method of claim 4, wherein
    the patterning the first conductive layer results in the first conductive portion being surrounded by the first opening.

6. The method of claim 4, wherein the forming the second conductive layer comprises
    filling the second opening with one or more conductive barrier layers.

7. The method of claim 4, wherein
    the first via and the second via are formed using one or more conductive barrier layers.

8. The method of claim 4, wherein the first and second conductive layers comprise different conductive materials.

9. The method of claim 4, wherein the first and second conductive layers comprise a same conductive material.

10. The method of claim 4, wherein the first and second conductive layers each include one or more layers of conductive materials.

11. The method of claim 4, wherein the second conductive portion extends beyond the perimeter of the circuit.

12. The method of claim 4, wherein the third conductive portion extends beyond the perimeter of the circuit.

13. The method of claim 4, wherein the second conductive portion covers an area that is at least 50 percent of the perimeter of the circuit.

14. The method of claim 4, wherein the second conductive portion has a thickness dimension, the second conductive portion extends beyond the perimeter of the circuit by a distance of at least ten times the thickness dimension.

\* \* \* \* \*